(12) United States Patent
Besling et al.

(10) Patent No.: US 6,562,732 B2
(45) Date of Patent: May 13, 2003

(54) METHOD OF MANUFACTURING A SEMICONDUCTOR DEVICE

(75) Inventors: Willem Frederik Adrianus Besling, Eindhoven (NL); Cornelis Adrianus Henricus Antonius Mutsaers, Eindhoven (NL); Dirk Jan Gravesteijn, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/942,493

(22) Filed: Aug. 30, 2001

(65) Prior Publication Data
US 2002/0028575 A1 Mar. 7, 2002

(30) Foreign Application Priority Data
Sep. 1, 2000 (EP) .............................. 00203040

(51) Int. Cl.⁷ ........................ H01L 21/31; H01L 21/469
(52) U.S. Cl. ....................... 438/780; 438/781; 438/789; 438/790
(58) Field of Search ................................. 438/763, 778, 438/780, 781, 789, 790, 793, 794; 257/522, 642, 643, 758

(56) References Cited
U.S. PATENT DOCUMENTS

| 5,461,003 A | 10/1995 | Havemann et al. ......... 437/187 |
| 6,071,809 A | 6/2000 | Zhao .......................... 438/634 |
| 6,265,321 B1 * | 7/2001 | Chooi et al. ................. 438/725 |

FOREIGN PATENT DOCUMENTS

| EP | 0911697 A2 | 4/1999 | ............. G03F/1/00 |
| JP | 195864 A | 7/2000 | |
| WO | 0019523 A1 | 4/2000 | |

* cited by examiner

Primary Examiner—Olik Chaudhuri
Assistant Examiner—Hsien Ming Lee
(74) Attorney, Agent, or Firm—Aaron Waxler

(57) ABSTRACT

The invention relates to a method of manufacturing a semiconductor device, comprising the provision of a dual damascene structure (20). This dual damascene structure (20) comprises a metal layer (1) with thereon a first dielectric layer (2) provided with a via (3). A second dielectric layer (5) is applied on the first dielectric layer (2) and is provided with an interconnect groove (6). The via (3) and the interconnect groove (6) are filled with a metal which forms a metal lead (9) with a top (10). The method further comprises the following steps:

removing the second dielectric layer (5),
  applying a disposable layer (12) to the first dielectric layer (2) and the metal lead (9),
  planarizing the disposable layer (12) down to the top (10) of the metal lead (9),
  applying a porous dielectric layer (13) on the disposable layer (12),
  removing the disposable layer (12) through the porous dielectric layer (13) so as to form air gaps (14).

According to the invention, the second dielectric layer (5) is used as a sacrificial layer in which the metal leads (9) are defined. By removing this layer (5) after defining the metal leads (9), the metal leads (9) stand out above the surface of the first dielectric layer (2). It is achieved by this that air gaps (14) can be formed next to the metal lead (9).

9 Claims, 2 Drawing Sheets

METHOD OF MANUFACTURING A SEMICONDUCTOR DEVICE

FIELD OF THE INVENTION

The invention relates to a method of manufacturing a semiconductor device, comprising the provision of a dual damascene structure which comprises a metal layer on which a first dielectric layer provided with a via is present, a second dielectric layer disposed on the first dielectric layer and provided with an interconnect groove, in which via and which interconnect groove a metal is present which forms a metal line having an upper side.

DESCRIPTION OF THE RELATED ART

Such a method is known from WO-A-0 019 523. In the known method, a first metal wiring pattern is obtained on a substrate, on which pattern a first layer of insulating material with a low dielectric constant, also referred to as "low-k" dielectric layer, is provided. A layer is provided thereon which acts as an etch stopper and in which a via pattern is provided. Then a second low-k dielectric layer is provided, on which a mask is formed. The mask is patterned, and a groove is etched into the second low-k dielectric layer by means of this mask down to the etch stopper layer. Etching then continues through the first low-k dielectric layer, so that a via is formed. The groove and the via are filled with metal such that this metal comes into electrical contact with the subjacent metal layer. The excess metal is removed, and a substantially planar upper side is formed.

Given the present development, in which the dimensions of integrated circuits become ever smaller, it is desirable to obtain a capacitance between the various conductors which is as low as possible. This may be achieved through the use of air gaps. According to the known techniques, however, it is not very well possible to form air gaps in dual damascene structures.

SUMMARY OF THE INVENTION

The invention has for its object inter alia to provide a method of the kind described in the opening paragraph whereby air gaps can be formed next to the metal line.

According to the invention, the method is for this purpose characterized in that the method further comprises the following steps:

- removal of the second dielectric layer,
- provision of a disposable layer on the first dielectric layer and the metal line,
- planarizing the disposable layer down to the upper side of the metal line,
- provision of a porous dielectric layer on the disposable layer, and
- removal of the disposable layer through the porous dielectric layer so as to form air gaps.

The use of a disposable layer for the formation of air gaps is known per se from U.S. Pat. No. 5,461,003. The method described in this document, however, is not directly applicable to a dual damascene structure. The metal line lies recessed in dielectric material in a dual damascene structure. The invention is based on the recognition that a process is to be used for obtaining exposed metal lines between which air gaps can be formed. It is especially the first step in the characterizing portion of the method according to the invention which ensures this.

An embodiment of the method according to the invention is characterized in that an etch stopper layer is present between the first dielectric layer and the second dielectric layer. The use of an etch stopper layer is known per se from WO-A-0 019 523. In this document, however, the layer is used as a hard mask for forming the via in the first dielectric layer. In the method according to the invention, the layer is also used as an etch stopper during the removal of the second dielectric layer after the formation of the dual damascene structure. An advantage of the etch stopper layer in the application according to the invention is that the first dielectric layer is shielded during the removal of the second dielectric layer and is not influenced by the etching process.

A further embodiment of the method according to the invention is characterized in that a non-conductive barrier layer is provided over the metal line after the removal of the second dielectric layer. Since the metal line is fully enclosed by this barrier, electromigration problems are counteracted.

In another embodiment a conductive barrier layer is provided over the metal line and the planarized disposable layer, and that the conductive barrier layer is structured by polishing so as to over the metal line only. The structuring of the conductive barrier layer is in fact a self-aligned process, and is known from JP 2000-195864. Suitable conductive barrier materials are for instance, Ta, Tin, TaN, W, TiNW. An advantage of the embodiment is that the metal, preferably copper, is capsulated. Due to the structuring the conductive barrier layer does not inhibit the removal of the decomposition products of the disposable layer through the porous dielectric layer. Another advantage, compared to the use of a non-conductive barrier layer is that the conductive barrier layer is not part of the dielectric between metal lines. Hence, the parasitic capacitance is decreased.

A further embodiment of the method according to the invention is in effect, the porous dielectric layer is thus any layer that permeable for gaseous molecules characterized in that a spin-on material is used for the porous dielectric layer. The provision of a porous dielectric layer by means of a spin coating process which is known per se has the advantage that such a process takes place at a low temperature. This low temperature renders it possible, for example with the use of a polymer as the disposable layer, to avoid problems such as premature degradation of the polymer.

A further embodiment of the method according to the invention is characterized in that a plasma CVD layer is used for the porous dielectric layer. An advantage of this that a plasma CVD (Chemical Vapor Deposition, known to those skilled in the art) layer provides an additional strength in the structure obtained by the method according to the invention.

BRIEF DESCRIPTION OF THE DRAWINGS

These and other aspects of the invention will be explained in more detail with reference to the drawings.

FIG. 1 shows a cross-section through the device after the formation of a dual damascene structure.

FIG. 2 shows the device after the removal of the second dielectric layer.

FIG. 3 shows the device after the provision of a non-conductive barrier layer over the metal line.

FIG. 4 shows the device after the provision of a disposable layer.

FIG. 5 shows the device after planarizing of the disposable layer.

FIG. 6 shows the device after the provision of a porous dielectric layer on the disposable layer.

FIG. 7 shows the device after the removal of the disposable layer.

DETAILED DESCRIPTION OF THE PREFERRED EMBODIMENTS

Figure 1:
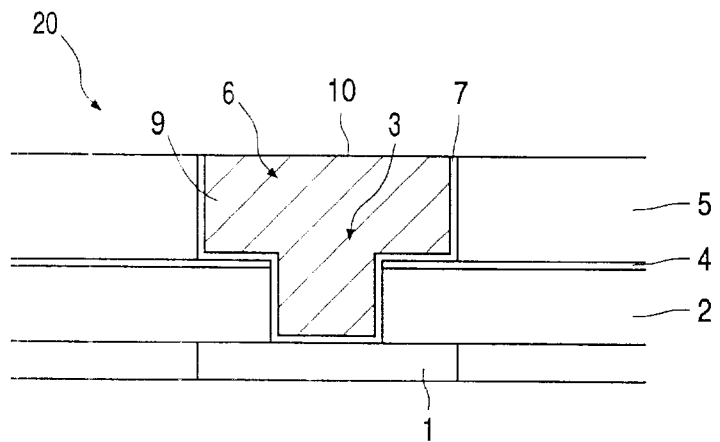
FIGS. 1 to 7 show a number of steps of a preferred embodiment of the method according to the invention for the manufacture of a semiconductor device.

FIG. 1 shows a dual damascene structure 20. This structure 20 was manufactured in a known manner (for example, see WO-A-0 019 523) and comprises a metal layer 1 on which a first dielectric layer 2 is present. This layer 2 preferably comprises a low-k dielectric such as a siloxane or a polyarylene ether such as, for example, SiLK™ (Dow Chemical). The metal layer 1 is obtained in a dielectric layer which is not of any further relevance to the invention. A patterned hard mask 4 is provided on the first dielectric layer 2. The hard mask 4 comprises, for example, SiN and serves as an etch stopper layer. A second dielectric layer 5 is provided on the etch stopper layer 4. The second dielectric layer 5 preferably comprises an oxide which is easy to apply and to remove, such as SOG or Nanoglass™ (Allied), but may alternatively comprise a polymer such as SiLK. A groove 6 and a via 3 are etched in the second and the first dielectric layer 5 and 2, respectively, by means of a hard mask on the second dielectric layer 5 and the patterned etch stopper layer 4 between the second and the first dielectric layer 5 and 2. It is possible to form such a structure without the use of the etch stopper layer 4, provided the second and the first dielectric layer 5 and 2 can be selectively etched relative to one another. The groove 6 and the via 3 are subsequently filled with a metal, whereby a metal line 9 is formed. The method according to the invention is particularly useful in a process in which copper is used as the interconnect metal. Alternative metals, however, may also be used, such as aluminum. If copper is used, a barrier and Cu-seed layer 7 is preferably first provided on the walls of the groove 6 and the via 3 before the copper is deposited in the groove 6 and the via 3. This layer 7, however, is not essential to the invention. After the groove 6 and the via 3 have been filled by means of Cu electroplating, the copper is planarized in a usual manner. The metal line 9 is provided with an upper side 10 in this manner. The mask by means of which the groove 6 was defined in the second dielectric layer 5 is finally removed. This mask, too, is not essential to the invention.

Figure 2:
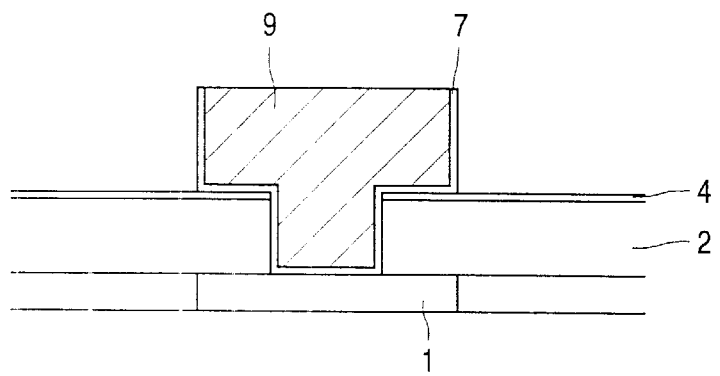

In FIG. 2, the second dielectric layer 5 is removed. The second dielectric layer 5 is used as a sacrificial layer which serves as a template for defining the metal lines 9. The removal of the sacrificial layer 5 may be effected by means of an HF dip in the case of an oxide, such as SOG or Nanoglass, or by means of a hydrogen plasma in the case of SiLK. Etching stops at the hard mask 4 which covers the subjacent dielectric 2. The metal lines 9 with or without barrier 7 remain intact and will come to lie at the surface owing to this etching treatment. Any copper oxide which may be present is reduced to copper by the hydrogen plasma.

Figure 3:
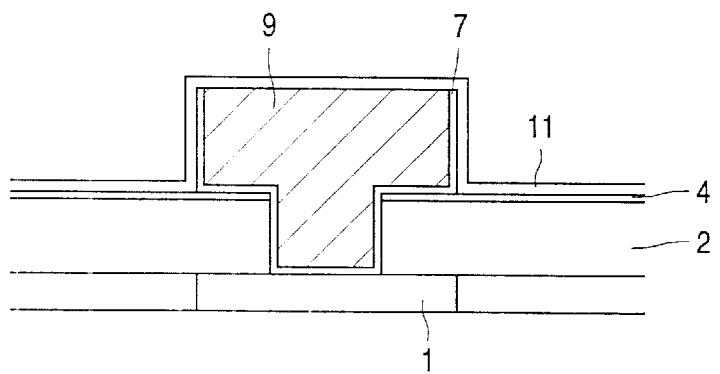

FIG. 3 shows a step in an embodiment of the method according to the invention in which a non-conductive barrier layer 11 is provided over the metal line 9 and the etch stopper layer 4. A plasma silicon nitride or silicon carbide barrier is preferably used for the barrier layer 11. The metal line 9 is fully enclosed by the non-conductive barrier layer 11. Electromigration problems and copper diffusion are counteracted thereby.

Figure 4:
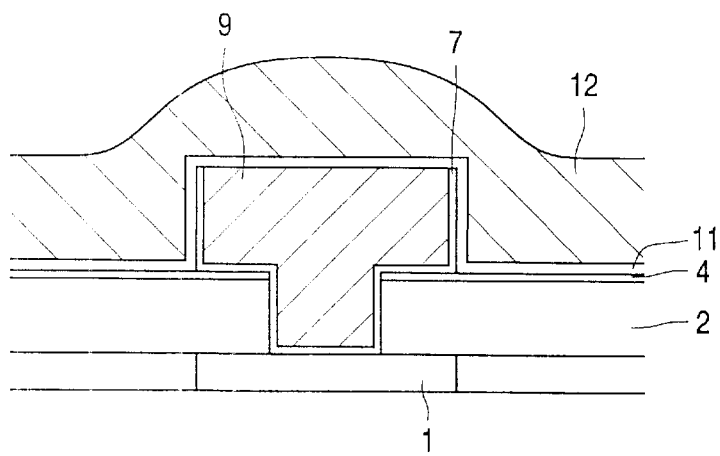

A next step in the method according to the invention is shown in FIG. 4. A disposable layer 12 is provided over the metal line 9. Preferably, a polymer which can be volatilized or degraded to smaller molecules is used for the disposable layer 12. Examples of this are PMMA (polymethyl methacrylate), polystyrene, and polyvinyl alcohol. A UV photoresist may also be used as the basic material for the manufacture of air gaps. Such an air gap polymer for forming the disposable layer 12 may be provided, for example, in that it is dissolved in a suitable solvent and is subsequently provided on the wafer by spin coating.

Figure 5:
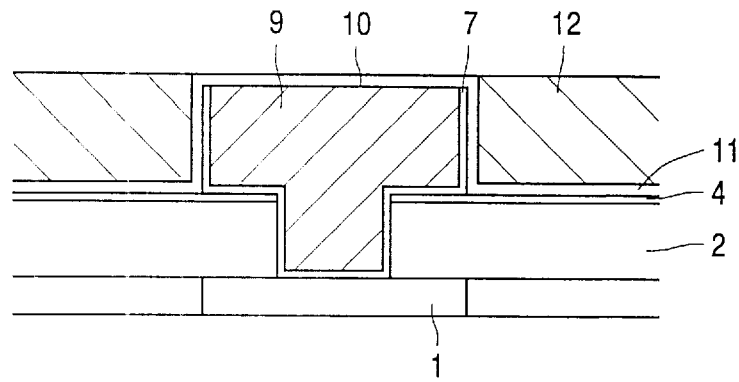

FIG. 5 shows the device after planarization of the disposable layer 12. If a polymer was used as the air gap material, this planarization may take place in that the polymer is etched back in an oxygen plasma or is polished back until the non-conductive barrier layer 11 becomes exposed at the upper side 10 of the metal line 9.

Figure 6:
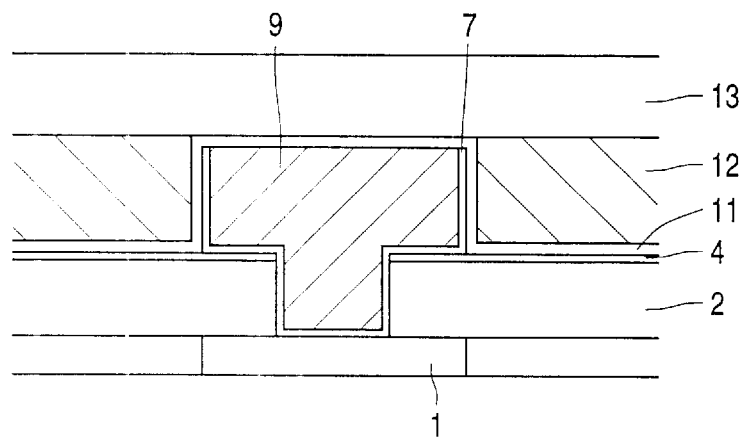

In FIG. 6, a porous dielectric layer 13 is provided on the disposable layer 12 and the metal line 9. The porous dielectric layer 13 preferably comprises a low-k dielectric such as SiLK, provided in a spin coating process. A plasma CVD layer may also be used as the porous dielectric layer 13.

Figure 7:
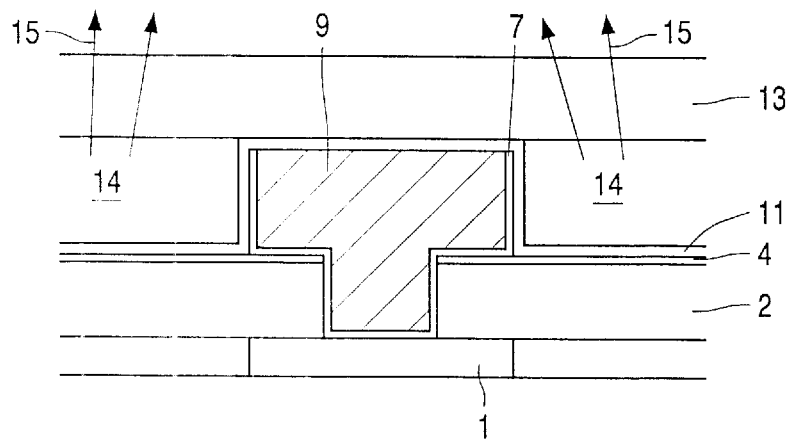

FIG. 7 shows a device manufactured by a method according to the invention. Air gaps 14 have been created next to the metal line 9. If a polymer was used for the disposable layer 12, the air gaps 14 may be obtained through a combined curing and baking step, preferably at 400° C. The air gap polymer is decomposed owing to the heating, and the air gap 14 is created below the porous dielectric layer 13. The creation of the air gaps 14 is symbolically depicted by the arrows 15. It was found that the porous dielectric layer 13 comprising SiLK can be spun on without problems to a thickness which corresponds to the height of the via 3 in the dual damascene structure 20, for example 0.5 $\mu$m. It is found that SiLK at this thickness is still sufficiently permeable for the removal of all the polymeric material.

The device thus obtained may be subjected to further process steps. Thus a hard mask may be provided on the porous dielectric layer. This mask is patterned and etched through in those locations where contact holes are to be made. Then a sacrificial layer is again provided, in which the metal lines are defined by means of a hard mask. Several interconnect layers are created in that the method according to the invention is repeated a number of times in this manner.

What is claimed is:

1. A method of manufacturing a semiconductor device, comprising a dual damascene structure (20) which comprises a metal layer (1), a first dielectric layer (2) provided with a via (3), a second dielectric layer (5) disposed on said first dielectric layer (2) and provided with an interconnect groove (6), and a metal in via (3) and interconnect groove (6) which forms a metal line (9) having an upper side (10), wherein the method further comprises the steps:

removing the second dielectric layer (5), providing a disposable layer (12) on the first dielectric layer (2) and the metal line (9), planarizing the disposable layer (12) down to the upper side (10) of the metal line (9)

providing a porous dielectric layer (13) on the disposable layer (12), and removing the disposable layer (12) through the porous dielectric layer (13) so as to form air gaps (14).

2. A method as claimed in claim 1, characterized in that an etch stopper layer (4) is present between the first dielectric layer (2) and the second dielectric layer (5).

3. A method as claimed in claim 1, wherein the metal used is Cu.

4. A method as claimed in claim 3, characterized in that a non-conductive barrier layer (11) is provided over the metal line (9) after the removal of the second dielectric layer (5).

5. A method as claimed in claim 4, characterized in that silicon nitride or silicon carbide is used as the non-conductive barrier layer (11).

6. A method as claimed in claim 1, characterized in that a spin-on material is used for the porous dielectric layer (13).

7. A method as claimed in claim 6, characterized in that the spin-on material comprises a polymer.

8. A method as claimed in claim 1, characterized in that a plasma CVD layer is used for the porous dielectric layer (13).

9. A method as claimed in claim 1, characterized in that the disposable layer (12) comprises a polymer, and in that the removal of the disposable layer (12) comprises a heating step.

* * * * *